(12) United States Patent
Yun et al.

(10) Patent No.: US 10,650,907 B2
(45) Date of Patent: May 12, 2020

(54) STORAGE PROTOCOL MATCHING DEVICE AND METHOD

(71) Applicants: EXICON INDUSTRIAL JOINT RND CENTER, Cheonan-si, Chungcheongnam-Do (KR); Exicon Co., Ltd., Seongnam-si, Gyeonggi-do (KR)

(72) Inventors: Jong Yun Yun, Hwaseong-si (KR); Soo Il Choi, Suwon-si (KR)

(73) Assignees: EXICON INDUSTRIAL JOINT RND CENTER, Cheonan-si, Chungcheongnam-Do (KR); EXICON CO., LTD., Seongnam-si, Gyeonggi-Do (KR)

( * ) Notice: Subject to any disclaimer, the term of this patent is extended or adjusted under 35 U.S.C. 154(b) by 19 days.

(21) Appl. No.: 16/117,546

(22) Filed: Aug. 30, 2018

(65) Prior Publication Data

US 2020/0043565 A1     Feb. 6, 2020

(30) Foreign Application Priority Data

Aug. 2, 2018     (KR) .................. 10-2018-0090194

(51) Int. Cl.
    *G11C 29/38*     (2006.01)
    *G06F 3/06*     (2006.01)
(52) U.S. Cl.
    CPC ............ *G11C 29/38* (2013.01); *G06F 3/0604* (2013.01); *G06F 3/0632* (2013.01); *G06F 3/0673* (2013.01)

(58) Field of Classification Search
    CPC ........................................................ G06F 3/06
    USPC ......................................... 714/722, 720, 718
    See application file for complete search history.

(56) References Cited

U.S. PATENT DOCUMENTS

| | | | |
|---|---|---|---|
| 8,407,413 B1* | 3/2013 | Yucel ..................... | H04L 69/22 709/203 |
| 8,943,234 B1 | 1/2015 | Voorhees et al. | |
| 2011/0138136 A1* | 6/2011 | Shitomi ................ | G06F 3/0604 711/154 |
| 2013/0237085 A1 | 9/2013 | Kim et al. | |
| 2016/0012465 A1* | 1/2016 | Sharp .................... | G06Q 20/18 705/14.17 |

FOREIGN PATENT DOCUMENTS

KR   10-2018-0046233        5/2018

* cited by examiner

*Primary Examiner* — Fritz Alphonse
(74) *Attorney, Agent, or Firm* — Kile Park Reed & Houtteman PLLC

(57) ABSTRACT

Disclosed is a storage test apparatus having a storage protocol matching device including an integrated protocol software unit and an integrated protocol hardware unit, in which, when an insertion of a storage is detected, a protocol configuration that matches a protocol of the storage is automatically set through a protocol switching, thereby enhancing the test efficiency.

6 Claims, 2 Drawing Sheets

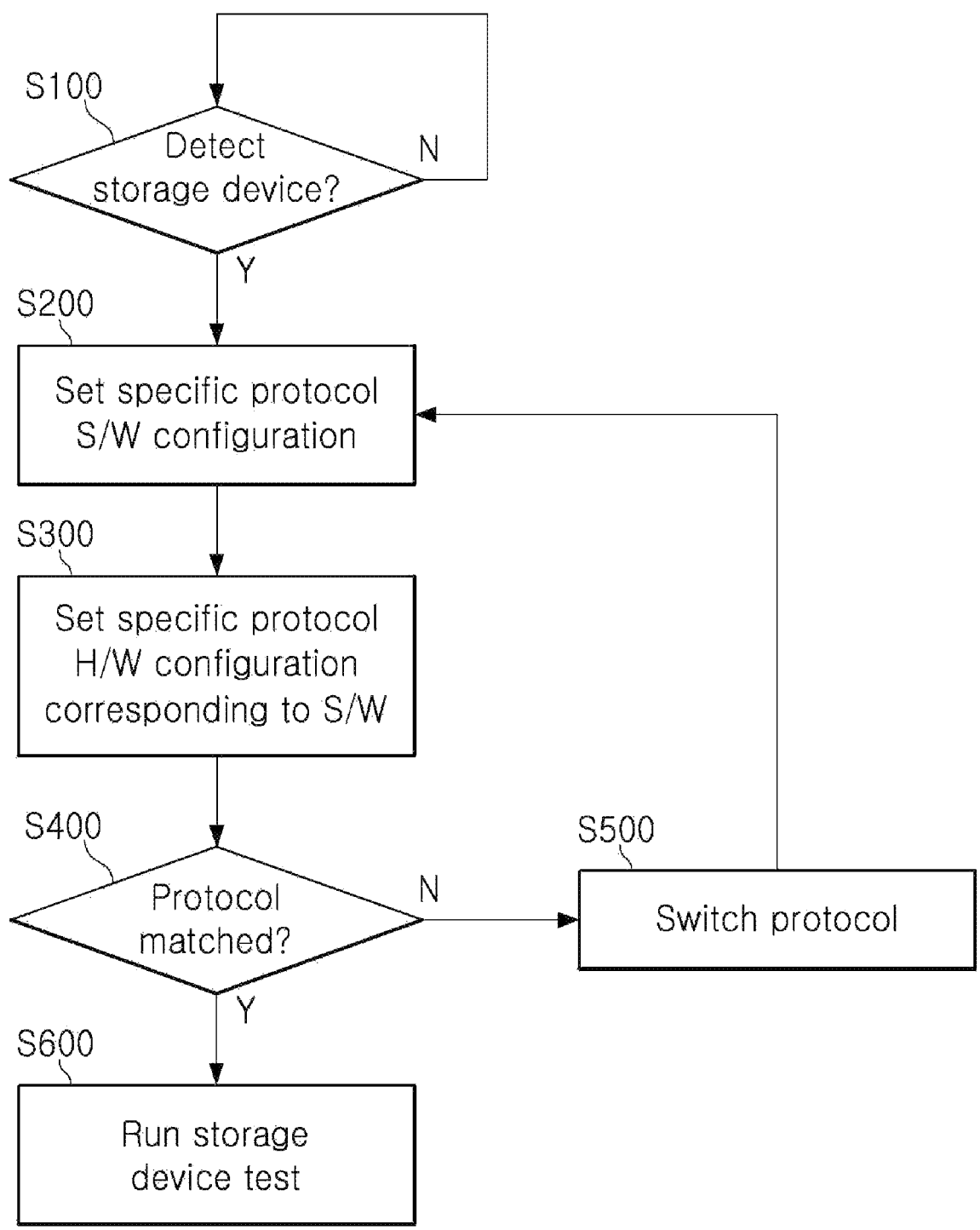

STORAGE PROTOCOL MATCHING DEVICE AND METHOD

CROSS-REFERENCE TO RELATED APPLICATION

This application claims priority to and the benefit of Korean Patent Application No. 2018-0090194, filed on Aug. 2, 2018, the disclosure of which is incorporated herein by reference in its entirety.

BACKGROUND

1. Field of the Invention

The present invention relates to a storage protocol matching device and method, and relates to a device that automatically performs protocol matching to improve compatibility, regardless of the type of a storage protocol.

2. Discussion of Related Art

Hard disk drives (HDDs) have been used as large-capacity digital media storages, but recently, among semiconductor devices serving as a memory, solid state drives (SSDs) capable of storing mass data, despite a small size, are getting attention. The SSDs are provided in various types, such as U.2, U.3, M.2, and the like according to the structure and shape, and Peripheral Component Interconnect Express (PCIe), Serial Attached SCSI (SAS), Serial Advanced Technology Attachment (SATA), Nonvolatile Memory Express (NVMe), and the like according to the application protocols.

The performance and failure of storages are tested by a storage test apparatus. When a tester tests an SSD (device under test: DUT) to which various protocols, such as PCIe, SAS, SATA, and the like, are applied, protocols which correspond to and assist the protocols should be applied to the tester.

Accordingly, when the tester is not compatible with the protocol of the SSD, a software driver and hardware components, such as a controller, a connector board, and the like of the tester, need to be replaced with ones that are compatible with the protocol of the SSD, or a performance test needs to be conducted using a plurality of test apparatuses as needed.

Korean Patent Unexamined Publication (No. 10-2018-0046233 "SSD Test Device") discloses a technique for compatibly testing SSDs having different protocols by performing an impedance matching through switching. However, there is no technique for automatically changing an internal protocol configuration of a tester.

SUMMARY OF THE INVENTION

The present invention is directed to providing a storage protocol matching device and method that allow an internal protocol configuration of a storage test apparatus to be automatically set to a protocol that matches a protocol of a storage such that the performances of various types of storages are tested using a single tester.

According to an aspect of the present invention, there is provided a storage protocol matching device including: a control unit configured to provide a command signal for protocol matching; an integrated protocol software unit connected to the control unit and including a plurality of mutually different pieces of protocol software; an integrated protocol hardware unit connected to the integrated protocol software unit and including a plurality of mutually different pieces of protocol hardware corresponding to the plurality of mutually different pieces of protocol software; a connector serving as an interface for transmitting and receiving a test signal of a storage device, and provided with a detection pin for detecting an insertion of the storage device; and a switch unit configured to perform a protocol switching, wherein the control unit controls the switch unit to sequentially switch the plurality of mutually different pieces of protocol software and the plurality of mutually different pieces of protocol hardware in response to detecting the insertion of the storage device until the switched protocol software and the switched protocol hardware match a protocol of the storage device.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 2 is a view illustrating a storage protocol matching method according to an embodiment.

DETAILED DESCRIPTION OF EXEMPLARY EMBODIMENTS

Figure 1:
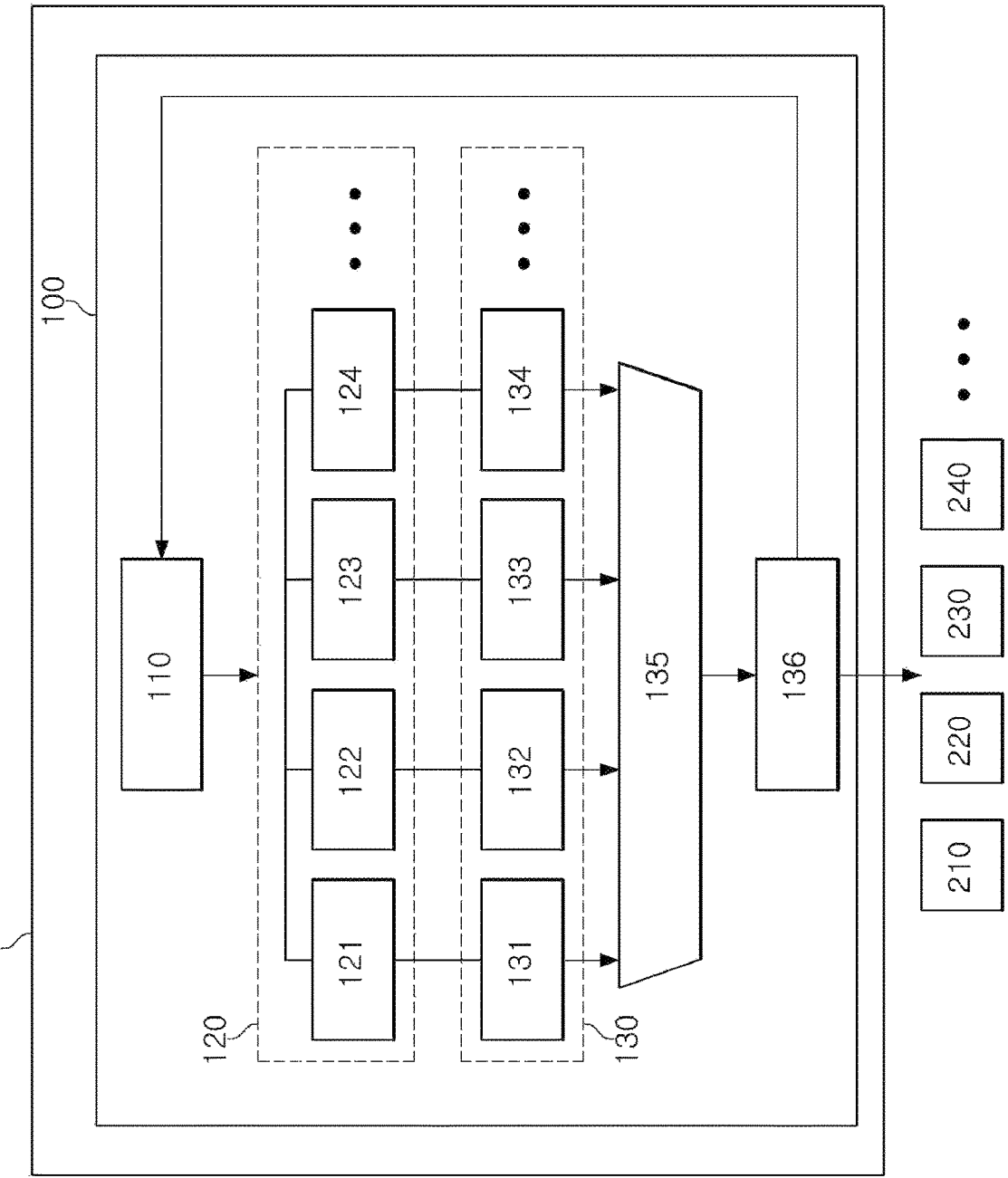
FIG. 1 is a view illustrating a storage test apparatus having a storage protocol matching device according to an embodiment.

Hereinafter, embodiments of the present invention will be described in detail with reference to the accompanying drawings to enable those skilled in the art to easily understand and practice the present invention. In the description of the embodiments, the detailed description of related known functions or constructions will be omitted herein to avoid making the subject matter of the present invention unclear. In addition, terms which will be described below are defined in consideration of functions in the embodiments of the present invention and may vary with an intention of a user, an operator, or a custom. Accordingly, the definition of the terms should be determined based on overall contents of the specification.

The above and other aspects of the present invention will become readily apparent by reference to the following detailed description of the embodiments. Although selectively described aspects or components thereof may each have been illustrated as assembled as a unit, it should be understood that unless otherwise stated, the respective components may be combined in any numbers unless the combination is explicitly inconsistent with the relevant art by those skilled in the art.

Therefore, the embodiments set forth herein and illustrated in the configuration of the present invention are only the most exemplary embodiments and are not representative of the full the technical spirit of the present invention, so it should be understood that the embodiments may be replaced with various equivalents and modifications.

FIG. 1 is a view illustrating a storage test apparatus having a storage protocol matching device according to an embodiment. Referring to FIG. 1, a storage test apparatus 1000 may include a storage protocol matching device 100. In the storage test apparatus 1000, a host controller may receive external power and operates to test malfunction or performance of a storage device, and the storage test apparatus 1000 may include a graphic user interface (GUI) that allows a user to control a test operation signal.

The storage protocol matching device 100 may include a control unit 110, an integrated protocol software unit 120, an integrated protocol hardware unit 130, a switch unit 135, and a connector 136.

The control unit 110 may generate a command signal for protocol matching and control an internal switching operation of the integrated protocol software unit 120 and/or the integrated protocol hardware unit 130. The control unit 110 may serve as a test S/W engine to generate a protocol switching operation command signal and to set a suitable protocol configuration.

The integrated protocol software unit 120, which is marked as a dotted line, may be electrically connected to the control unit 110 and include a plurality of mutually different pieces of protocol software 121, 122, 123, and 124. The piece of software may refer to an application program for a test. The plurality of pieces of protocol software 121, 122, 123, and 124 may be a Peripheral Component Interconnect Express (PCIe) driver, a Nonvolatile Memory Express (NVMe) driver, a Serial Attached SCSI (SAS) driver, and a Serial Advanced Technology Attachment (SATA) driver, but implementation of the software is not limited thereto and the software may be implemented using various types of protocol drivers. The integrated protocol software unit 120 may be stored in a single memory device (e.g., a hard disk) such that the plurality of pieces of protocol software 121, 122, 123, and 124 are managed in an integrated manner.

The integrated protocol hardware unit 130, which is marked as another dotted line, may be electrically connected to the integrated protocol software unit 120 and may include a plurality of mutually different pieces of protocol hardware 131, 132, 133, and 134 corresponding to the plurality of pieces of protocol software 121, 122, 123, and 124. The piece of hardware may refer to a circuit. The plurality of pieces of protocol hardware 131, 132, 133, and 134 may be a PCIe controller, an NVMe controller, an SAS controller, and an SATA controller, but implementation of the hardware is not limited thereto and the hardware may be implemented using various types of protocol controllers. The integrated protocol hardware unit 130 may be provided in a single printed circuit board (PCB) such that the plurality of pieces of protocol hardware 131, 132, 133, and 134 are managed in an integrated manner.

The connector 136 may serve as an interface for transmitting and receiving a test signal of the storage device, and may be provided with a detection pin (not shown) for detecting an insertion of the storage device. The detection pin may be provided as a combination of a plurality of pins. For example, the detection pin may be provided as a combination of pins corresponding to P10, P4, and E39.

The connector 136 may be a single connector into which various structures and shapes of storage devices 210, 220, 230, and 240 are compatibly inserted. The connector 136 may include a plurality of pins and serve as an interface for electrical connection with the storage devices 210, 220, 230, and 240. Adjacent pins among the plurality of pins may be grouped based on an application protocol. The storage devices 210, 220, 230, and 240 may each be a solid state drive (SSD).

The switch unit 135 may perform a switching function to switch protocols. The switch unit 135 may be formed using software or hardware.

The switch unit 135 may be disposed to connect the integrated protocol hardware unit 130 to the connector 136.

The control unit 110 may control the switch unit 135 to sequentially switch a plurality of pieces of protocol software and a plurality of pieces of protocol hardware in response to detecting an insertion of the storage device until the switched protocol software and the switched protocol hardware match a protocol of the storage device. For example, the control unit 110 may set protocol software and protocol hardware of the storage protocol matching device 100 to adapt to a PCIe configuration in response to detecting an insertion of the storage device, and determine whether the set protocol software and the set protocol hardware match a protocol of the storage device, and when the set protocol software and the set protocol hardware do not match the protocol of the storage device, switch the set protocol software and the set protocol hardware to adapt to a NVMe configuration and determines whether the switched protocol software and the switched protocol hardware match the protocol of the storage device.

Accordingly, when a user sets a configuration that matches a storage protocol, the hassle to manually replace a software driver and a hardware controller of the test apparatus is eliminated.

In a storage protocol matching device 100 according to another embodiment, a control unit 110 may control pieces of protocol software and the pieces of protocol hardware to be sequentially switched for each groups including the pieces of protocol software and the pieces of protocol hardware grouped by similar protocols. In detail, when PCIe and NVMe are grouped into one group and SAS and SATA are grouped into another group, the control unit 110 may control the groups to be sequentially switched. For example, the sequential switch may be performed in the order of PCIe, NVMe, SAS, and SATA, thereby enhancing the switching efficiency. Pieces of hardware having similar protocols may be disposed adjacent to each other.

FIG. 2 is a view illustrating a storage protocol matching method according to an embodiment. Referring to FIG. 2, the storage protocol matching method includes detecting an insertion of a storage device (S100), setting a configuration of specific protocol software (S200), setting a configuration of specific protocol hardware corresponding to the specific protocol software (S300), determining whether the set configurations match a protocol of the storage device (S400), and switching the set configuration of the protocol software and the set configuration of the protocol hardware to a configuration of different protocol software and a configuration of different protocol hardware when the set configurations do not match the protocol of the storage device, and determining whether the configurations match the protocol of the storage device (S500).

In the storage protocol matching method according to the embodiment, the setting of the configuration of the specific protocol software (S200) may be performed after the setting of the configuration of the specific protocol hardware corresponding to the specific protocol software (S300). Alternatively, operations S200 and S300 may be simultaneously performed.

In a storage protocol matching method according to another embodiment, the determining of whether the configurations match the protocol of the storage device (S500) may include sequentially switching a plurality of mutually different pieces of protocol software and a plurality of mutually different pieces of protocol hardware until the switched protocol software and the switched protocol hardware match the protocol of the storage device.

A storage protocol matching method according to still another embodiment may further include performing a test on the storage device (S600) when the configurations match the protocol of the storage device (S600).

As is apparent from the above, a multi-protocol assisted device and method can enhance the test efficiency by compatibly performing a test without having to replace parts of the test apparatus when a storage device (DUT) is changed.

What is claimed is:

1. A storage protocol matching device comprising:
    a control unit configured to provide a command signal for protocol matching;
    an integrated protocol software unit connected to the control unit and including a plurality of mutually different pieces of protocol software;
    an integrated protocol hardware unit connected to the integrated protocol software unit and including a plurality of mutually different pieces of protocol hardware corresponding to the plurality of mutually different pieces of protocol software;
    a connector serving as an interface for transmitting and receiving a test signal of a storage device, and provided with a detection pin for detecting an insertion of the storage device; and
    a switch unit configured to perform a protocol switching, wherein the control unit controls the switch unit to sequentially switch the plurality of mutually different pieces of protocol software and the plurality of mutually different pieces of protocol hardware in response to detecting the insertion of the storage device until the switched protocol software and the switched protocol hardware match a protocol of the storage device.

2. The storage protocol matching device of claim 1, wherein the detection pin includes a combination of a plurality of pins.

3. The storage protocol matching device of claim 1, wherein the switch unit is disposed to connect the integrated protocol hardware unit to the connector.

4. The storage protocol matching device of claim 1, wherein the storage device is a solid state drive (SSD).

5. A storage test apparatus including the storage protocol matching device according to claim 4.

6. The storage protocol matching device of claim 1, wherein the control unit controls the pieces of protocol software and the pieces of protocol hardware to be sequentially switched for each group including the pieces of protocol software and hardware grouped by similar protocols.

* * * * *